Dec. 20, 1966 R. T. DIVERS 3,293,083

THERMOELECTRIC STRUCTURES

Filed July 2, 1962

INVENTOR.
RAYMOND T. DIVERS.
BY J. Raymond Curtis
ATTORNEY.

United States Patent Office 3,293,083

Patented Dec. 20, 1966

3,293,083
THERMOELECTRIC STRUCTURES

Raymond T. Divers, Camillus, N.Y., assignor to Carrier Corporation, Syracuse, N.Y., a corporation of Delaware Filed July 2, 1962, Ser. No. 206,686
3 Claims. (Cl. 136—230)

Figure 1:
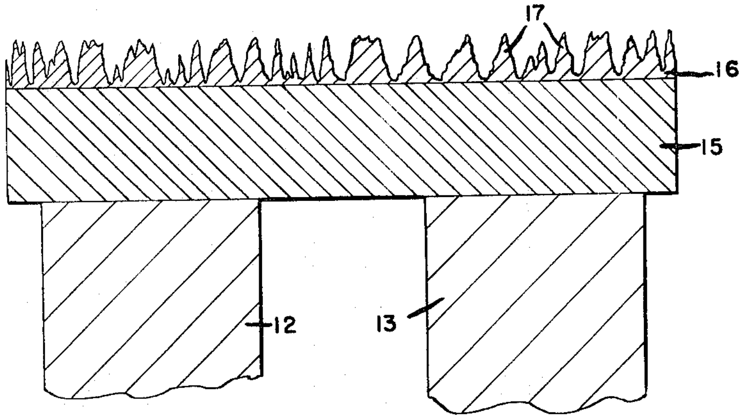

This invention relates to thermoelectric structures, more particularly to means for electrically insulating the bridge between thermoelectric elements forming thermoelectric structures.

Thermoelectric devices or structures have been evolved utilizing the fact that the juncture of two dissimilar metals or semimetals into an electric circuit results either in a temperature differential between the points of juncture in the circuit upon the flow of current therethrough, or reversibly a flow of current upon the maintenance of the junctures at different temperatures. In apparatus of this type, a relatively large number of pairs of thermoelectric elements must be utilized. The dissimilar elements are joined together by "bridges," and a series of pairs or couples are joined into a continuous circuit having alternating hot and cold bridges. These bridges must be arranged in heat transfer relationship with respect to a heat source and a heat absorbing sink so as to permit efficient functioning of the apparatus either for purposes of generating electricity, or for purposes of effecting heat pumping between two given areas.

In order to effect heat transfer between the bridges and any given area, the bridges must be placed in heat exchange relationship with this area. As will be understood by those skilled in the art, in most instances a material having a high heat transfer efficiency will also have a high electrical conductivity. Since it is necessary to electrically insulate the thermoelectric bridges, and at the same time provide for a facility of heat transfer to and from the bridges, a number of problems arise.

It has been found that copper conductor strips are most efficiently utilized as bridges forming the cold junction between thermoelectric elements. Aluminum oxide or alumina serves to provide efficient thermal conductivity to and from the copper bridge and at the same time electrically insulates the copper bridge. With this fact in view, alumina has been flame sprayed onto the copper surface. The alumina insulating layer, however, is structurally weak, and it is difficult to bond the alumina surface to any heat transfer surface.

It is with the above problems and desiderata in mind, that the present means have been evolved, means including both method and apparatus serving to implement the insulation of the bridges between the elements of thermoelectric devices. The novel means provides a relatively strong structural surface which may readily be bonded to a heat transfer element serving to implement the transfer of heat to and from the bridge. Additionally, heat transfer through the electrical insulator is implemented by the provision of continuous material paths with a minimum of interface boundaries.

It is accordingly an object of this invention to provide improved insulating means serving to electrically insulate an element, while at the same time simultaneously implementing thermal conduitivity to and from the element.

A further object of the invention is to provide means minimizing the interface barriers to thermal conductivity in an insulating material.

It is also an object of the invention to provide electrical insulating means of relatively high thermal conductivity which may readily be bonded to conventional heat transfer materials.

Another important object of the invention is to provide improved insulating means for the cold bridge of a thermoelectric generator serving to electrically insulate the bridge while implementing heat transfer between the bridge and a heat sink.

These and other objects of the invention which will become hereafter apparent are attained by forming an alumina layer between the conventionally utilized copper bridge and the area with which it is desired to place the copper bridge in a heat transfer relationship. In lieu of the conventionally used flame spray technique employed for depositing the alumina layer on the copper conductor strap forming the bridge, an aluminum sheet is metallurgically bonded to the copper strap with the outside aluminum surface anodized to a depth insufficient to contact the metallurgical bond region between the copper and aluminum. The bond between the cooper and aluminum may be obtained in any conventional fashion either by soldering; heating the aluminum in contact with the copper in an appropriate atmosphere; or physically forcing the aluminum and copper to bond by a roll or drawing operation. Thereafter, anodizing of the aluminum by conventional anodizing processes, either the use of sulphuric acid baths or the like, is employed to form the desired alumina insulation.

An important feature of the invention resides in the fact that the alumina insulating layer has a continuous structure with a minimum number of interface barriers to heat transfer.

Another important feature of the invention resides in the relatively high aluminum oxide density as compared to a flame sprayed alumina deposit, with the subsequent improvement in thermal conductivity and dielectric strength.

An additional feature of the invention resides in the relatively high quality bond obtained between the aluminum and cooper as compared to the bond between flame deposited alumina and copper.

Figure 2:
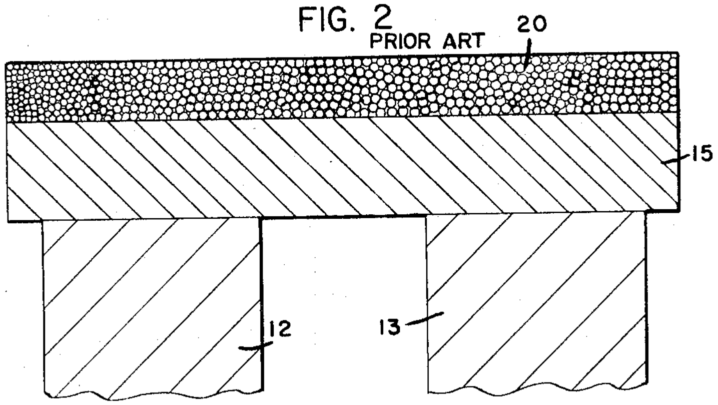
FIG. 2 PRIOR ART

The specific details of a preferred embodiment of the invention, and their mode of attainment will be made most manifest and particularly pointed out in clear, concise, and exact terms in conjunction with the accompanying drawings, wherein:

FIGURE 1 is a schematic cross-sectional view through the elements of a thermoelectric device and the cold bridge between the elements, illustrating the nature of the novel insulating technique; and FIGURE 2 is a cross-sectional view through a pair of elements of a thermoelectric device showing the cold bridge and the insulation obtained by a conventionally employed flame spray technique.

Referring now more particularly to the drawings, like numerals in the various figures will be employed to designate like parts.

As best seen in FIGURE 1, a pair of thermoelectric elements 12 and 13 are shown coupled by means of a copper bridge 15 across their cold junction. It will be understood by those skilled in the art that elements 12 and 13 are conventional P and N type elements such as utilized in forming thermoelectric couples. Bonded to the copper bridge 15 by any conventional bonding technique utilized to form a secure bond between copper and aluminum is an aluminum sheet 16 extending over the entire area of the copper strap 15 remote from the elements 12 and 13.

Aluminum sheet 16 may readily be bonded to copper strap 15 by soldering the copper to the aluminum by first zinc plating the aluminum and thereafter utilizing a tin-based solder to effect the desired metallurgical bond between the copper and the aluminum. Alternatively, heating of the copper and aluminum to approximately 900° F. and applying contact pressure will result in the attainment of the desired bond. The most desired bond of course, as will be apparent to those skilled in the art, is one in which the aluminum copper interface is substantially eliminated by forming a solid solution transition alloy between the copper and the aluminum.

Thereafter an anodized surface 17 is formed on the aluminum sheet 16 to a depth less than that which would contact the bond region between the copper and aluminum.

Anodizing is accomplished by the utilization of conventional anodizing techniques such, for example, as the use of a sulphuric acid bath timed to limit the anodizing action to the portion of the aluminum sheet remote from the aforementioned bond area.

In use, the aforedescribed structure is employed preferably in connection with a thermoelectric generator, where the hot junction (not shown) employs iron bridges in heat exchange relationship with the heat source panel. The heat from the iron bridges is transferred through the P and N type thermoelectric elements to the copper straps 15 which form the cold bridge between the thermoelectric elements.

As will be apparent to those skilled in the art, it is necessary to electrically insulate the cold bridge 15 from the heat sink, and at the same time it is desirable to promote heat transfer from the cold bridge 15 to the heat sink. By utilizing the teachings of the instant invention, this can be most readily attained. Thus, the provision of an aluminum oxide coating on the copper cold bridge 15 serves to attain the desired result of providing electrical insulation while simultaneously implementing heat transfer.

The novel aspects of the invention are perhaps made most apparent by a consideration of conventional usage such as exemplified by the FIGURE 2 structure. In the FIGURE 2 structure, the cold bridge 15 is shown provided with an alumina insulating layer 20 formed by flame deposition of the alumina on the copper surface of bridge 15. As is apparent from a consideration of FIGURE 2, heat transfer from the copper 15 through the alumina layer 20 cannot be as efficient as that through anodized layer 17 due to the relatively large number of interfaces between the deposited particles forming layer 20.

Additionally, the continuous crystalline structure present in the layer 17 of FIGURE 1 provides for increased structural strength and greater density serving to improve thermal conductivity and facility of connection to heat transfer elements to the cold sink.

It is thus seen that by the simple expedient of anodizing an aluminum sheet bonded to the copper forming the cold bridge of a thermoelectric device, a high thermal condutcivity, and high structural strength electrical insulator is provided.

The above disclosure has been given by way of illustration and elucidation, and not by way of limitation, and it is desired to protect all embodiments of the herein disclosed inventive concept within the scope of the appended claims.

I claim:

1. In a thermoelectric device having thermoelectric elements coupled together at their cold junction by a copper cold bridge conductor strap, and a heat sink to which the heat dissipated by the cold bridge may be transferred, insulation for the cold bridge serving to electrically insulate the bridge from the sink while simultaneously implementing heat transfer between the bridge and sink, said insulation comprising: an aluminum sheet bonded to the surface of the cold bridge; and an anodized surface layer on said aluminum sheet remote from the surface of the bridge, whereby an insulating alumina layer will be formed between the bridge and sink.

2. A thermoelectric generator as in claim 1 in which said anodized surface layer does not extend to more than 50% of the depth of said aluminum sheet.

3. A thermoelectric generator as in claim 1 in which said anodized layer extends through a range of between 10% and 90% of the thickness of the aluminum sheet.

References Cited by the Examiner

UNITED STATES PATENTS

| | | | |
|---|---|---|---|
| 2,846,493 | 8/1958 | Lindenblad | 136—5 |
| 3,057,940 | 10/1962 | Fritts | 136—4 |
| 3,075,360 | 1/1963 | Elfving et al. | 62—3 |
| 3,090,206 | 5/1963 | Anders | 136—4.2 |

FOREIGN PATENTS

| | | |
|---|---|---|
| 816,574 | 7/1959 | Great Britain. |
| 821,115 | 9/1959 | Great Britain. |

JOHN H. MACK, *Primary Examiner.*

MURRAY TILLMAN, *Examiner.*

L. G. WISE, W. VANSISE, *Assistant Examiners.*